United States Patent
Brown et al.

(10) Patent No.: US 7,151,494 B2
(45) Date of Patent: Dec. 19, 2006

(54) REFLECTIVE AND TRANSMISSIVE MODE MONOLITHIC MILLIMETER WAVE ARRAY SYSTEM AND OSCILLATOR USING SAME

(75) Inventors: Kenneth W. Brown, Rancho Cucamonga, CA (US); James R. Gallivan, Pomona, CA (US)

(73) Assignee: Raytheon Company, Waltham, MA (US)

( * ) Notice: Subject to any disclaimer, the term of this patent is extended or adjusted under 35 U.S.C. 154(b) by 36 days.

(21) Appl. No.: 11/122,372

(22) Filed: May 4, 2005

(65) Prior Publication Data

US 2005/0200533 A1    Sep. 15, 2005

Related U.S. Application Data

(63) Continuation-in-part of application No. 10/734,445, filed on Dec. 12, 2003, now Pat. No. 7,034,751.

(51) Int. Cl.
*H01Q 1/38* (2006.01)
(52) U.S. Cl. .............................. 343/700 MS; 343/786; 343/754; 333/21 A
(58) Field of Classification Search ......... 343/700 MS, 343/786, 754; 333/21 A
See application file for complete search history.

(56) References Cited

U.S. PATENT DOCUMENTS

| | | | |
|---|---|---|---|
| 4,504,836 A * | 3/1985 | Seavey | 343/761 |
| 5,214,394 A | 5/1993 | Wong et al. | |
| 5,392,152 A | 2/1995 | Higgins et al. | |
| 5,398,035 A * | 3/1995 | Densmore et al. | 373/713 |
| 6,765,535 B1 * | 7/2004 | Brown et al. | 343/700 MS |
| 7,034,751 B1 * | 4/2006 | Brown et al. | 343/700 MS |

OTHER PUBLICATIONS

Bialkowski, M.E. et al.: "Investigations Into A Power-Combining Structure Using A Reflect Array of Dual-Feed Aperture-Coupled Microstrip Patch Antennas" IEEE Transactions on Antennas and Propagation, IEEE Inc. New York, US, vol. 50, No. 6, Jun. 2002, pp. 841-849, XP001123069, ISSN: 0018.

Pogorzelski, R.J.: "Two-Dimensional Array Beam Scanning Via Externally and Mutually Injection-Locked Coupled Oscillators" IEEE—Transactions on Antennas and Propagation, IEEE Inc. New York, US, vol. 49, No. 2, Feb. 1, 2001, pp. 243-249, XP001006623, ISSN: 0018.

Tsai, H. S. et al: "Planar Amplifier Array with Improved Bandwidth Using Folded-Slots" IEEE Microwave and Guided Wave Letters, IEEE Inc., New York, US, vol. 4, No. 4, Apr. 1, 1994, pp. 112-114, XP000442740 ISSN: 1051-8207.

* cited by examiner

*Primary Examiner*—Tan Ho
(74) *Attorney, Agent, or Firm*—Thomas J. Finn; John E. Gunther; Karl A. Vick

(57) ABSTRACT

An oscillator. In the illustrative embodiment, the oscillator includes an ortho-mode feed; a reflective amplifier array adapted to be illuminated by the feed with an input wavefront with a first polarization and to return thereto an amplified wavefront with a second polarization orthogonal to the first wavefront; and a partially reflective plate disposed between the feed and the amplifier. The inventive oscillator provides a Fabry-Perot cavity between the feed and the plate. In the illustrative embodiment, the plate is a polarized plate. The plate may have surfaces with dissimilar polarizations and/or curvatures. The amplifier may be phase locked by an ortho-mode converter or other arrangement.

25 Claims, 8 Drawing Sheets

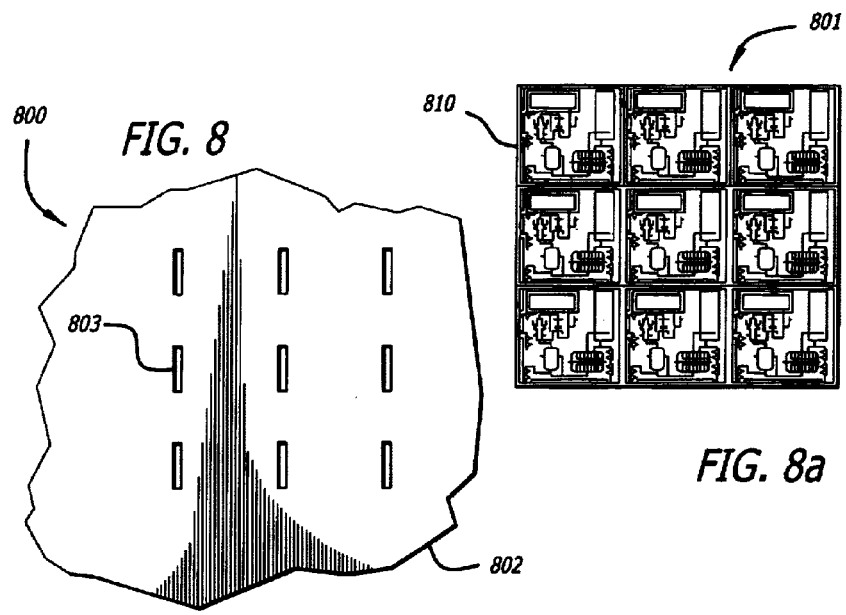
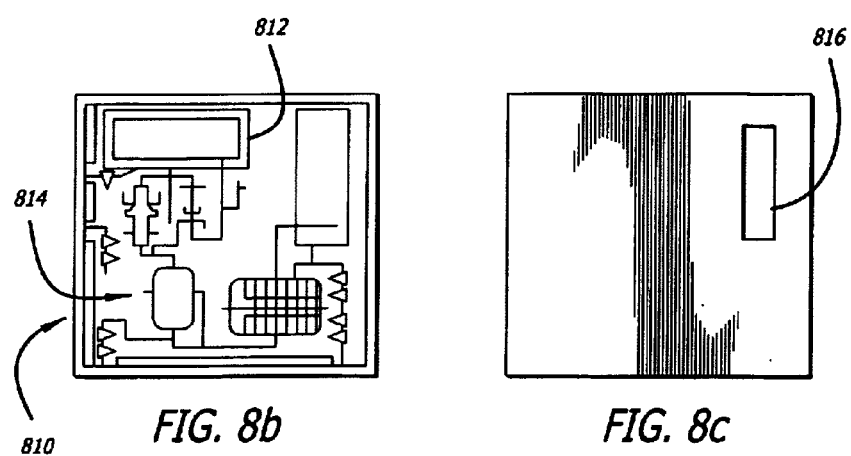

US 7,151,494 B2

REFLECTIVE AND TRANSMISSIVE MODE MONOLITHIC MILLIMETER WAVE ARRAY SYSTEM AND OSCILLATOR USING SAME

REFERENCE TO RELATED APPLICATION

This is a continuation in part of U.S. patent application Ser. No. 10/734,445, now U.S. Pat. No. 7,034,751 filed Dec. 12, 2003 by K. W. Brown et al. and entitled REFLECTIVE AND TRANSMISSIVE MODE MONOLITHIC MILLIMETER WAVE ARRAY SYSTEM AND IN-LINE AMPLIFIER USING SAME the teachings of which are hereby incorporated herein by reference and from which priority is hereby claimed.

BACKGROUND OF THE INVENTION

1. Field of the Invention:

This invention relates to power devices. Specifically, the present invention relates to semiconductor power devices.

2. Description of the Related Art:

Techniques have been developed for producing W-band semiconductor power devices (e.g. 50 Ghz to 120 Ghz). For example Gunn and Impatt diode sources have been developed which produce ¼ watt of power. However, these sources are very expensive. Indium Phosphide High Electron Mobility Transistor (InP HEMT) amplifiers have been developed which produce 1/10 watt of power. However these devices range from $10,000 to $20,000 in cost. Lastly, technologies are being developed which produce heat with high-frequency microwave beams. These technologies require power in the 100 KW to 1 MV range. However, devices implemented with these technologies (tubes) may cost millions of dollars each.

In general, devices implemented with conventional technologies do not generate affordable power in the W-band. In addition, the flexibility of conventional power systems, such as Gunn and Impatt diodes and InP HEMT amplifiers, is limited.

Thus, there is a need in the art for a cost effective high power W-band power system. That is, there is a need in the art for a W-band power system that can be inexpensively configured, to provide variable output power levels. Lastly, there is a need for a W-band power system that takes advantage of current semiconductor manufacturing technology to minimize costs.

The above-referenced related U.S. patent application Ser. No. 10/153,140, now U.S. Pat. No. 6,765,535 filed May 20, 2002 by K. W. Brown et al. and entitled MONOLITHIC MILLIMETER WAVE REFLECTOR ARRAY SYSTEM addresses this need by providing a monolithic millimeter wave reflect array system. However, there is a further need for a transmissive mode implementation and for a system or method for providing an in-line amplifier using the array.

SUMMARY OF THE INVENTION

The need in the art is addressed by the oscillator of the present invention. In the illustrative embodiment, the oscillator includes an ortho-mode feed; a reflective amplifier array adapted to be illuminated by the feed with an input wavefront with a first polarization and to return thereto an amplified wavefront with a second polarization orthogonal to the first wavefront; and a partially reflective plate disposed between the feed and the amplifier. The inventive oscillator provides a Fabry-Perot cavity between the feed and the plate.

In the illustrative embodiment, the plate is a polarized plate. The plate may have surfaces with dissimilar polarizations and/or curvatures. The amplifier may be phase locked by an ortho-mode converter or other arrangement.

BRIEF DESCRIPTION OF THE DRAWINGS

FIG. 8 shows an alternative by which the array is implemented as a transmissive array in accordance with an illustrative embodiment of the teachings of the present invention.

FIG. 8a shows a magnified view of a portion of the array of FIG. 8.

FIG. 8b shows a front view of a single cell of FIG. 8b in accordance with an illustrative embodiment of the present teachings.

FIG. 8c shows a rear view of the cell of FIG. 8b.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention is designed to produce high energy density and high power level RF/Millimeter wave radiation using the quasi-optical spatial power of an array of small amplifiers on a solid-state wafer. In an illustrative reflective mode implementation, each cell of the array contains a reflection amplifier that receives radiation and retransmits the amplified signal back into the approximate same direction from which it was received. The radiation exiting from the array is physically like a reflection that has been modified by the individual amplifier's characteristics. The exiting amplified radiation leaves the array as a coherent wave front.

The individual amplifier elements are fabricated on a monolithic solid-state wafer. Rather than being diced into individual amplifiers, the elements are electrically connected together with proper biases and ground levels on the actual solid-state wafer or a sub-set of the wafer. This allows an entire array to be fabricated and electrically biased on a typical 3 to 4 inch diameter solid-state wafer. When working in the W-Band Millimeter Wave region this could allow on the order of a thousand amplifiers per wafer. Because each solid-state amplifier is limited to in the order of 100 mW, the wafer power output would be in the order of 100 watts.

From antenna theory, the array elements need to be small with respect to the wavelength. The amplifiers are built to be 0.5 to 1.0 wavelength or less in side dimension on the individual array elements. The array element includes antennas of two polarizations, bias and ground wiring and amplifiers. All the elements are fabricated on the solid-state wafer.

In the illustrative embodiment, the incident radiation is polarized and the exiting radiation is shifted to an orthogonal polarization. Two patch antennas are used per amplifier. The incident antenna has the same polarization as the incoming radiation to the array and the exiting radiation is in the orthogonal plane relative to the transmit antenna.

Figure 1:
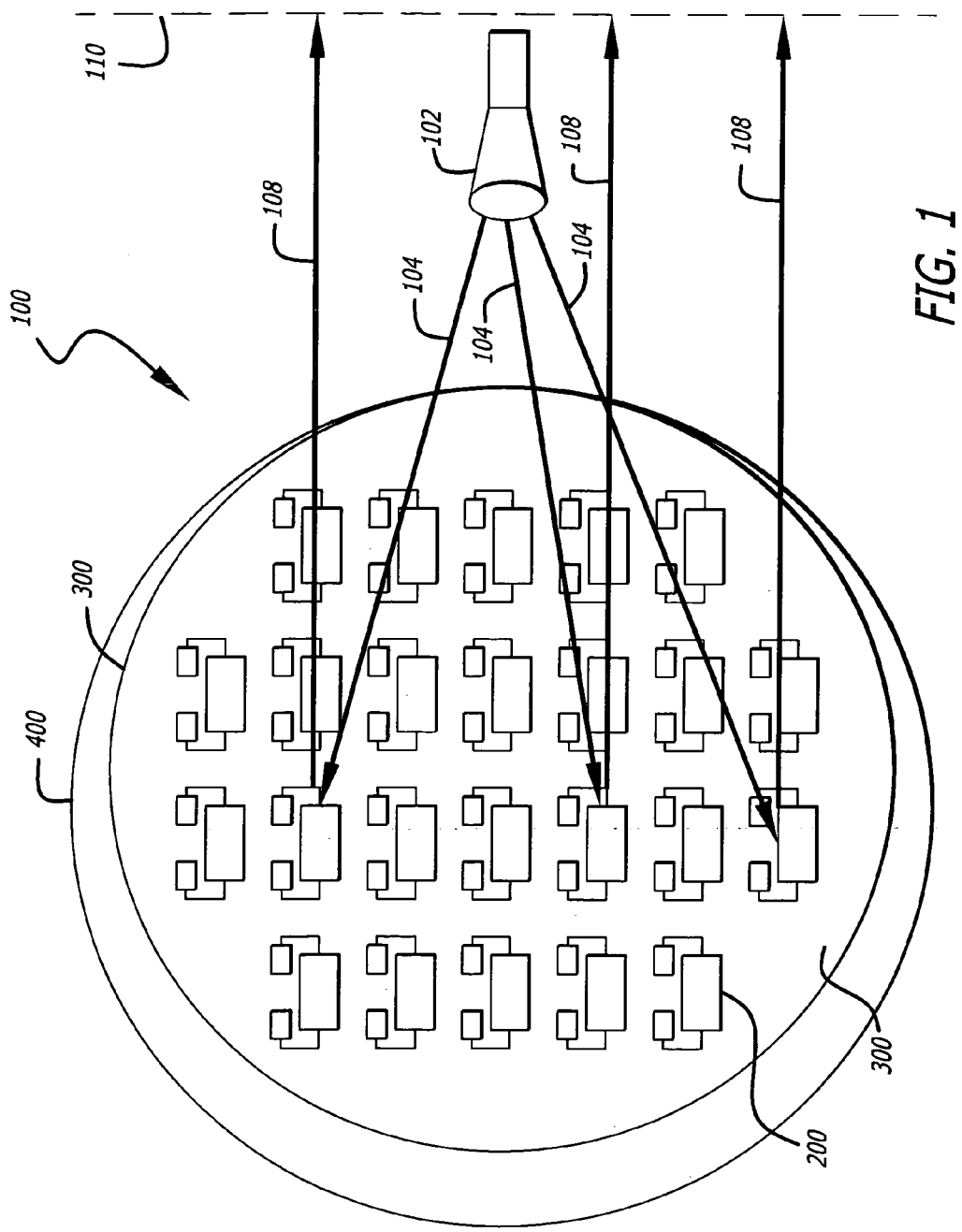
FIG. 1 is a schematic diagram of an illustrative embodiment of a monolithic, millimeter-wave, active reflect array implemented in accordance with the teachings of the present invention.

FIG. 1 is a schematic diagram of a monolithic, millimeter-wave, active reflect array implemented in accordance with the teachings of the present invention. The array 100 is fed by a conventional low power source 102, which generates incident energy 104 in the W-band. The array 100 includes a plurality of cells 200 disposed on a monolithic substrate 300. In the illustrative embodiment, the monolithic semiconductor substrate 300 is Indium Phosphide (InP). The monolithic semiconductor substrate 300 is in contact with a cold plate 400 for cooling.

Figure 2:
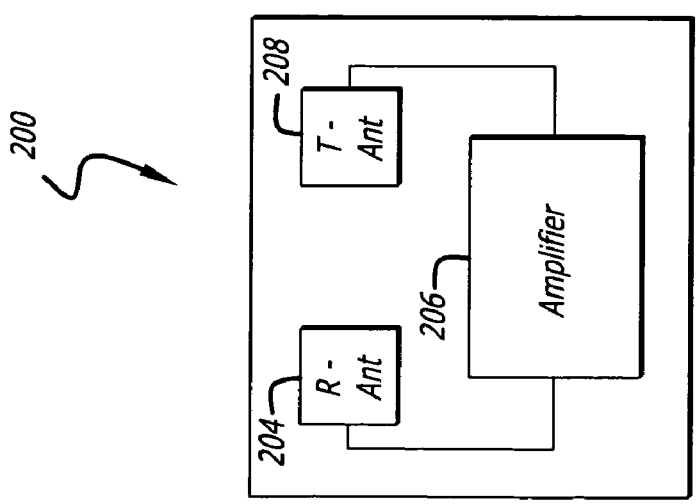
FIG. 2 displays a high-level block diagram of an individual cell of the array of cells of FIG. 1.

FIG. 2 displays a high-level block diagram of an individual cell 200 of the array of cells 100 of FIG. 1. In the preferred embodiment of the present invention, each cell 200 is designed to be small with respect to the wavelength of incident energy directed at the monolithic semiconductor substrate 300. Thus, in the illustrative embodiment, each cell 200 is designed to be 0.5 to 1.0 wavelengths or less in width and height dimensions. Those skilled in the art will appreciate that the present invention is not limited to the dimensions of the cells.

As illustrated in FIG. 2, each cell 200 includes a receive patch antenna 204 for receiving incident energy, an amplifier 206 and a transmit antenna 208. The cells 200 are arranged to receive the incident energy 104. The received energy is amplified by the amplifier 206 and retransmitted via the transmit patch antenna 208. The array of cells 106, reflect the incident energy 104 and produce reflected energy 108. In the best mode, the incident energy received by the receive patch antenna 204 has a first polarization relative to the receive antenna 204 and the reflected energy generated by the transmit patch antenna 208 has a second polarization relative to the transmit antenna 208 orthogonal to the first polarization. The reflected energy 108 is reflected in a coherent manner and therefore forms a high power wave front 110 (see FIG. 1). Those skilled in the art will appreciate that the present invention is not limited to the use of patch antennas.

In the best mode, the array 100 is optimized for high output power for a given size, high-efficiency and low cost. A noteworthy aspect of the invention is the practical matter in which thousands of low power millimeter amplifiers can be used to produce a high power energy level.

Returning to FIG. 1, to maximize the power output and power density, the power of each element must be maximized. This is accomplished by directly attaching the wafer 300 to the cooling plate 400 to remove heat and reduce the temperature of the individual amplifiers to a reliable level for the given output. Ideally, the wafers are attached directly to the cold plate with very thin bonding material only so that the cooling heat of the elements is maximized. The interconnect wiring should be efficiently cooled. The cold plate 400 can take several forms such as a heat sink, a thermoelectric cooler or a liquid cooled plate depending on the dynamics of the amplifiers duty cycle without departing from the scope of the present teachings.

Figure 3:
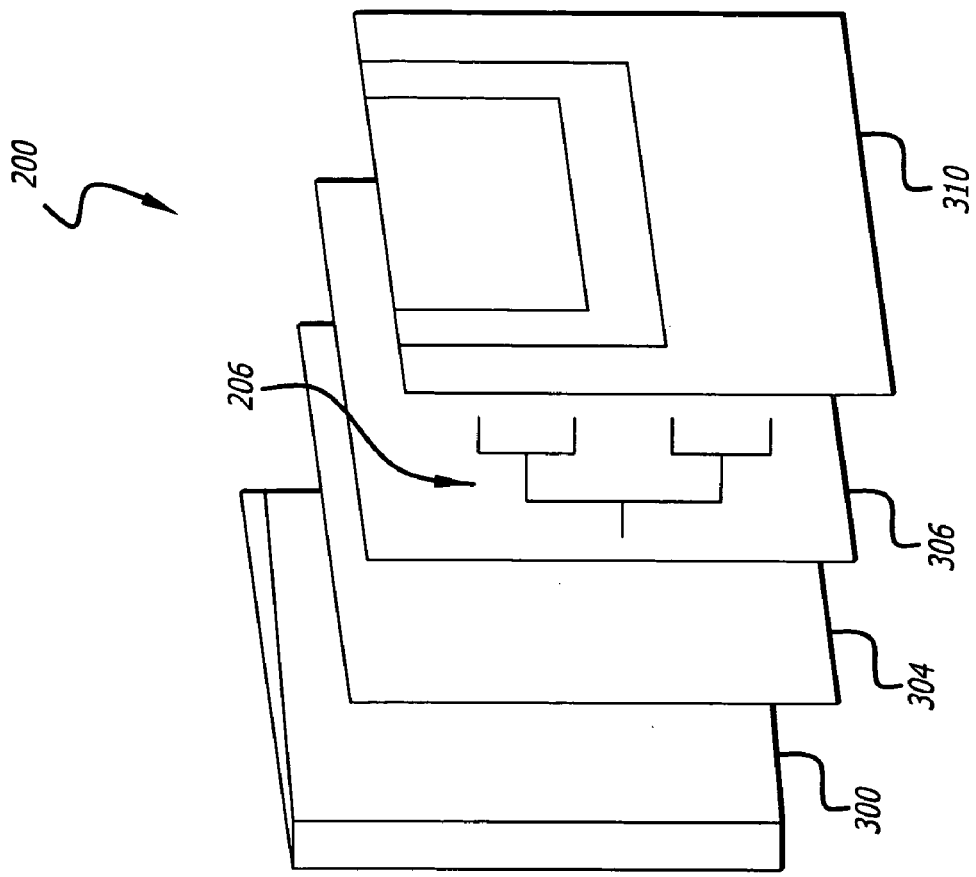
FIG. 3 magnified, fragmentary exploded view of a single cell of the array of FIG. 1.

FIG. 3 is a magnified, fragmentary exploded view of a single cell of the array of FIG. 1. In general, in the best mode, very thin layers of a solid-state substrate are made using materials of as high a thermal conduction as possible. A deposited and etched layer is then added providing all the electrical interconnects, components, amplifiers, and grounding planes. As discussed more fully below, the dual polarization antenna structures are disposed in uppermost layers.

In accordance with an illustrative embodiment of the teachings of the present invention, a monolithic InP substrate 300 is formed in a conventional manner. A first metal layer 304 is then applied to the substrate using conventional fabrication techniques. The first metal layer 304 serves as a DC supply line for the cell 200. A first layer of oxide (not shown) is applied to the first metal layer as an intermediate layer in forming the cell. A second metal layer 306 is then applied. The second metal layer 306 serves as the DC ground of the cell and includes amplifier circuits 206. In addition, the second metal layer 306 serves as an intermediate layer for vias connecting upper layers to the lower metal layer 304 and the substrate 302. A second layer of oxide is applied as a second intermediate layer in forming the cell. Lastly, patch antennas are formed in a third metal layer 310.

In the illustrative embodiment, a monolithic Indium Phosphide (InP) semiconductor substrate is used. An epitaxy layer is formed on the substrate to reduce crystalline or contaminate defects. In the illustrative embodiment of the present invention, the substrate dimensions are approximately 4 inches by 4 inches.

The pattern of the amplifier circuit and the antenna circuit included in a cell, are implemented in the substrate with a mask. Each layer of the semiconductor device is developed using a specific mask. The mask contains the amplifier circuit design and the antenna circuit design elements. Both the amplifier circuit design and the antenna circuit design are formed using pattern generation equipment (e.g. computer graphic circuit design equipment), which is driven by a circuit design database. The mask starts as a design schematic and is then transformed into a layout for implementation in the InP substrate. The finished mask product is referred to as a recticle. The InP substrate is coated with a photoresist material. In a photolithography process, the mask containing the amplifier and antenna design is exposed by a light source, through a lens system, onto the substrate. The mask is then stepped over to the next area of the substrate and the process is repeated until the substrate is completely exposed (e.g. this is often called a step and repeat process).

In the illustrative embodiment, the entire wafer (e.g. 4 inches×4 inches), or a large sub-section of the wafer (e.g. 0.5" to 0.5"), other wafer fabrication techniques, such as electron beam lithography can also be utilized. While the invention is not limited to any particular fabrication technique, two methods are described here. In a first method, the input and output feeds of a specific circuit are designed such that the output for one mask, physically aligns with the input for a second mask. As a result, after the step and repeat process, the input and output for each circuit on the substrate align and create a single unified circuit that covers the entire substrate.

In a second method, a mask is implemented with a dual mask set. A larger mask, including required power and output connections is etched into the entire substrate. The larger mask is implemented at the proper level in the InP device to facilitate power conduction (e.g. a power line mask). A second, smaller integrated circuit mask is then used to etch the integrated circuits into the substrate. The second mask is a high resolution mask and is designed so that the integrated circuits from the second mask align with the power line connections etched into the substrate from the first mask.

In addition to the two methods for etching the designs into the substrate, the mask are designed and the stepper function is performed, so that as many cells as possible are placed in series. This allows higher voltages and lower currents to be used. As a result the final circuit has lower resistive loss, smaller metallic line widths and lower heat generation. An etch process (wet or dry) is used to remove oxide where the photoresist pattern is absent. The photoresist is then stripped off the substrate, leaving the oxide pattern on the substrate. The substrate is then exposed to high temperature to grow an oxide layer.

The oxide acts as a barrier when dopant chemicals are deposited on the surface and diffused into the surface. Alternatively, dopants may be bombarded into the InP surface. The induced ions create regions with different properties. These regions become the source and drain of transistors. A deposition process is performed in which, an opening is made in the oxide to build the transistor's gate region. A thin gate oxide or silicon nitride is deposited through a Chemical Vapor Deposition (CVD) process to act as an insulator between the gate and the InP. This is followed by Physical Vapor Deposition (PVD) or "sputtering" of a conductive polysilicon layer to form the transistor's gate.

An oxidation process is performed in which various oxides are grown or deposited to insulate or protect the formed transistors. Deep Field Oxides are grown to isolate each transistor from its adjacent partners. Dielectric isolation oxides are deposited to insulate the transistors from interconnecting layers. Passivation oxides are later deposited on top of completed substrate to protect the surface from damage.

Interconnections are made using the photolithography process mentioned above. Contact holes (e.g. vias) are etched down to the transistor regions to establish circuit connections. Metallization is then performed. A layer of a metallic substance such as aluminum is deposited on the surface and down into the via holes. Excess aluminum is etched away after another photolithography process, leaving the desired interconnect pattern. Another layer of dielectric isolation oxide is deposited to insulate the first layer of aluminum from the next. Each step produces surface contours. The surface of the wafer is polished smooth using techniques such as Chemical Mechanical Planarization. The smooth surfaces maintain photolithographic depth of focus for subsequent steps and also ensure that aluminum interconnects do not deform. Layers are then interconnected. Another set of via holes is etched in the dielectric isolation oxide to enable access down to the layer below. Contact plugs are deposited (often tungsten) into the vias to reach down and make contact to the lower layer. The next layer of aluminum is deposited, patterned and etched. This process is repeated for as many interconnect layers as a required for the design.

In the present invention, this repeated process forms a cell by matching and managing the shielding and dielectric properties of the metal and oxide layers.

Figure 4:
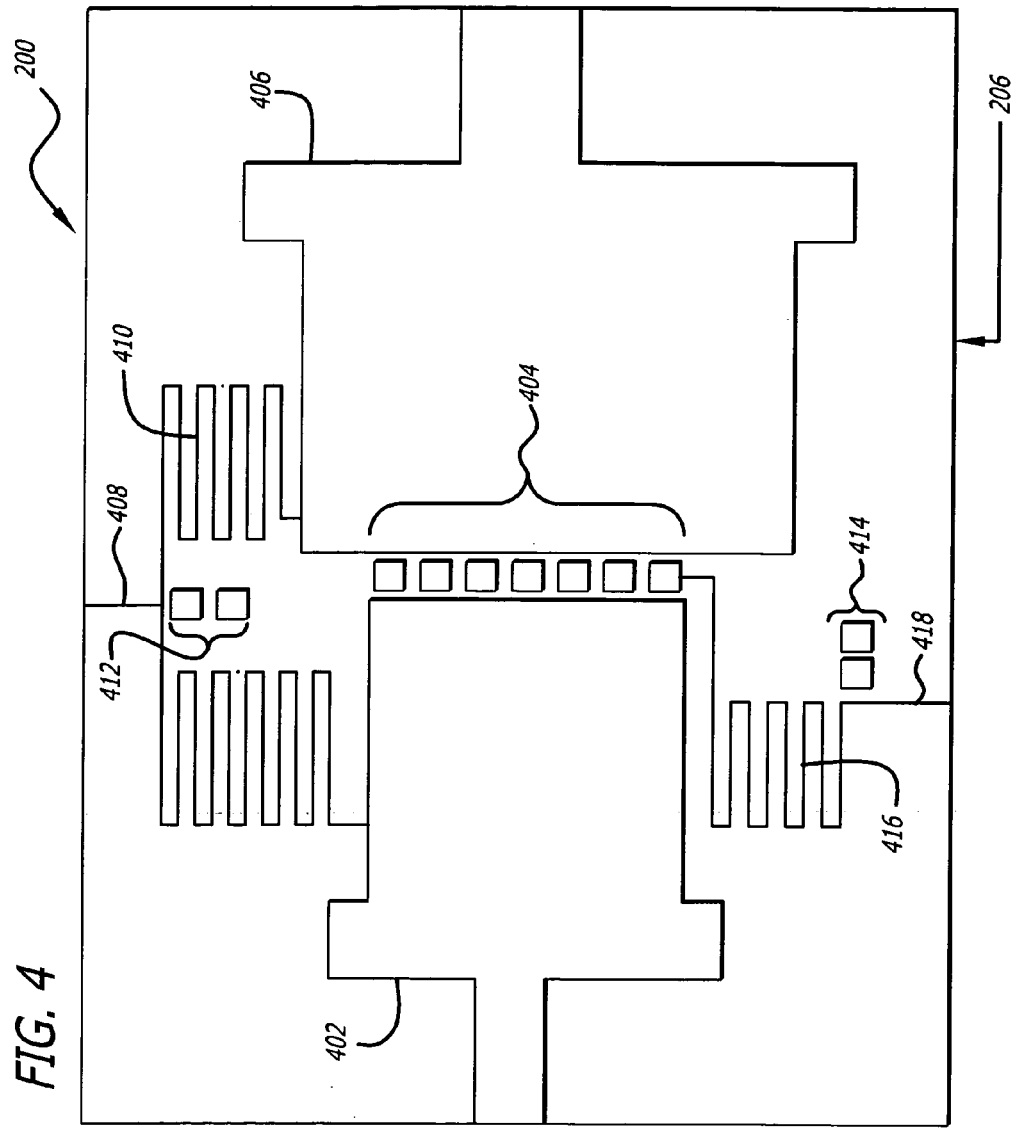
FIG. 4 displays a W-band semiconductor layout of an individual cell of the array of the present invention.

FIG. 4 displays a W-band semiconductor layout of an individual cell 200 of the array of the present invention. In FIG. 4, the amplifier 206 includes an RF matching network. The RF matching network includes an input matching circuit 402, a transistor/capacitor network 404 and an output matching circuit 406. Direct current (DC) power is fed into the network through a DC supply 408. A first isolation inductor 410 isolates DC power from the RF matching network. A capacitor connected to a ground plane is shown as 412. A DC ground is shown as 418. A second isolation inductor 416 isolates the RF matching network from ground. A second capacitor is shown as 414. The capacitors, 404, 412 and 414, isolate the DC power from the RF power and also isolate the RF input matching network from the RF output matching network.

Figure 5:
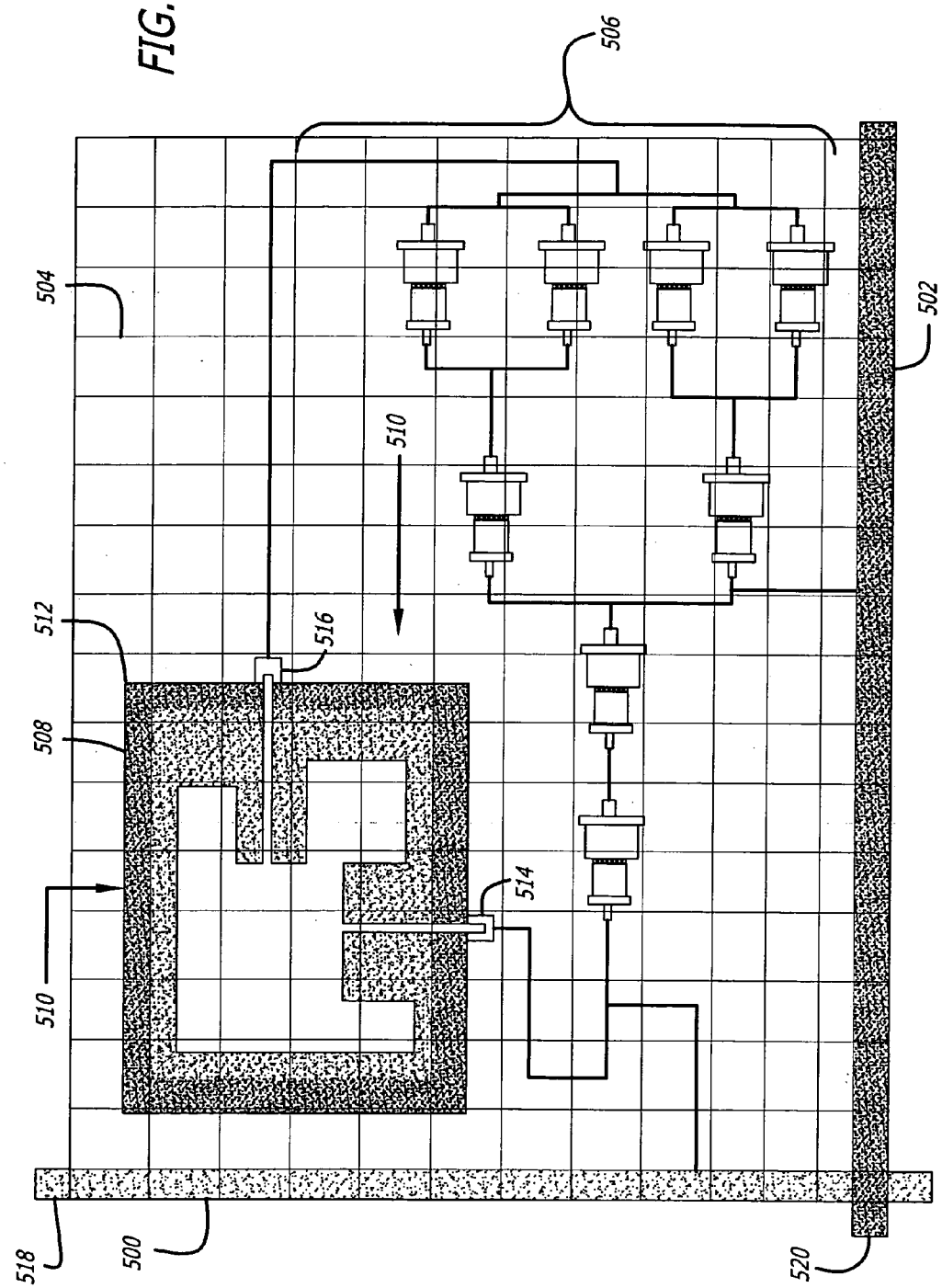
FIG. 5 shows a multistage amplifier with a patch antenna for the array of FIG. 1 in accordance with the teachings of the present invention.

FIG. 5 shows a multistage amplifier with a patch antenna for the array of FIG. 1 in accordance with the teachings of the present invention. In FIG. 5 a first metal layer is shown as 500. The first metal layer 500 serves as the DC supply line for the monolithic semiconductor device. An amplifier network 506 is implemented in the first metal layer 500. A second metal layer 502 is shown. The second metal layer 502 serves as the DC ground for the monolithic semiconductor device. A third metal layer 504 is also shown. A patch antenna 510 is implemented in the third metal layer. The patch antenna 510 may be implemented with a corrugated wideband patch or a two layer corrugated wideband patch. A plurality of vias 512 establishes DC connection between the first metal layer 500, the second metal layer 502 and the third metal layer 504. An input to the patch antenna is shown as 514 and an output from the patch antenna is shown as 516. The amplifier network 506 is designed in series with respect to the DC power and in parallel with respect to RF signals. It should be noted that both the DC supply (e.g. first metal layer 500) and the DC ground (e.g. second metal layer 502) extend beyond the third metal layer 504, so that when the individual cells are combined to form an array, a single circuit will be established between the cells.

In each individual cell 200, the first metal layer 500 includes an overlapping portion 518. The overlapping portion 518 is implemented to provide a single DC supply to each cell in the array of cells. A second overlapping portion is shown as 520. The second metal layer 502 includes the second overlapping portion 520 and is implemented to provide a single DC ground to each cell in the array of cells. As a result, each cell in the array of cells combines to form a single circuit with a single DC supply and a single DC ground.

The energy does not have to be radiated into space but can be used in an in-line amplifier configuration.

Those skilled in the art will also appreciate that the array of amplifier elements can be assembled with respect to an array size optimized for fabrication. The array elements can then be tiled onto a cooling plate until enough elements exist to produce needed output power levels.

Figure 6:
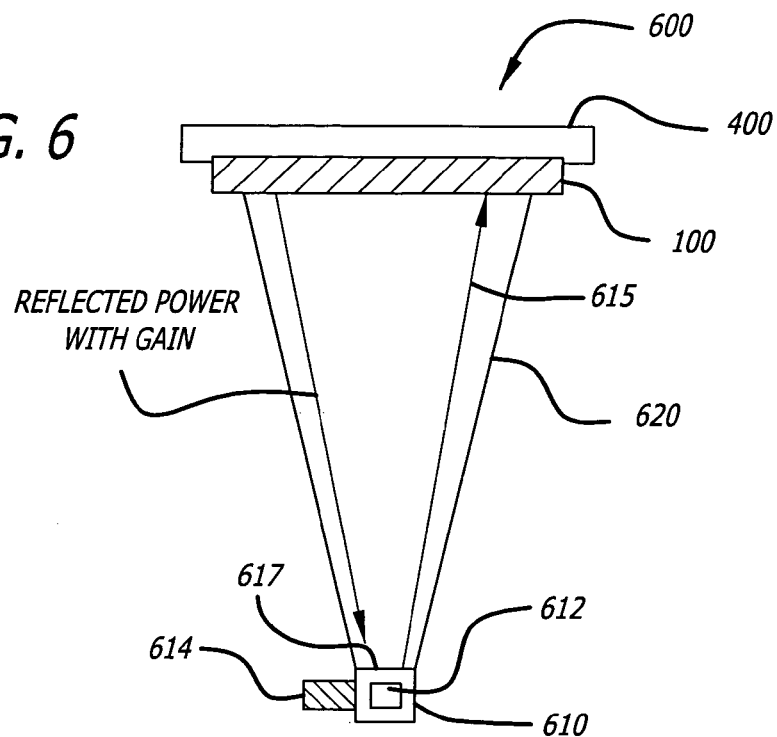
FIG. 6 shows an oscillator using a reflection amplifier implemented in accordance with an illustrative embodiment of the present teachings.

FIG. 6 shows an oscillator using a reflection amplifier implemented in accordance with an illustrative embodiment of the present teachings. The oscillator 600 has an orthomode feed 610 having two inputs, a vertical mode connector input 612, which sends or receives a vertically polarized wave, and the other being a horizontal mode port 614 adapted to send or receive a horizontally polarized wave. The ortho-mode feed 610 of the oscillator 600 is a waveguide connector with a vertical mode connector input 612, which receives a vertically polarized wave. The ortho-mode feed may be of conventional design and construction. In the illustrative embodiment, the vertical connector serves as a feed input port and the horizontal mode port serves as an output port.

In accordance with the present teachings, a partially reflecting plate 617 is mounted between the array 100 and the feed 610. The horn section 620 between the amplifier array 100 and the partial reflecting plate 617 constitutes a Fabry-Perot oscillator cavity and works according to well-known theory. After the amplifier plate receives input signals, due to either its own noise level being amplified or due to having a signal being injected by any of a number of methods, the feedback form the Fabry-Perot cavity will case the unit to oscillate and produce an output signal. The reflecting plate 617 can be a polarized plate that is rotated to allow most of the vertically polarized energy to exit the vertically polarized output port 614 and reflect back a small part of the orthogonal horizontal energy to the horizontal polarization input antennas of the amplifiers on the amplifier substrate 100.

The horizontally polarized input wave illuminates the array 100 of reflective amplifier cells implemented in accordance with the present teachings. The horizontal radiation to the amplifier is amplified and sent back as a vertically polarized signal to the reflecting plate 617 and the vertical output port 614. The array 100 is disposed on a cooling plate 400.

In the best mode, the plate 400 has channels to allow for the flow of a cooling fluid therethrough. The wave is contained within the walls of a horn 620. The horn is conductive and may be corrugated or have other wave front correcting features added in accordance with the present teachings.

Thus, in a single integrated unit, an input wave is amplified, collimated and output in a desired polarization. The oscillator can be phase locked to another signal by converting the wave guide adapter 610 into an orthomode converter and injecting a reference signal into the horizontal waveguide port 612. The signal could also be injected without using an orthomode connector with an antenna element or feed from many places such as on the amplifier array 100 or fed in from the side or through a feed hole that goes through the array.

Figure 7:
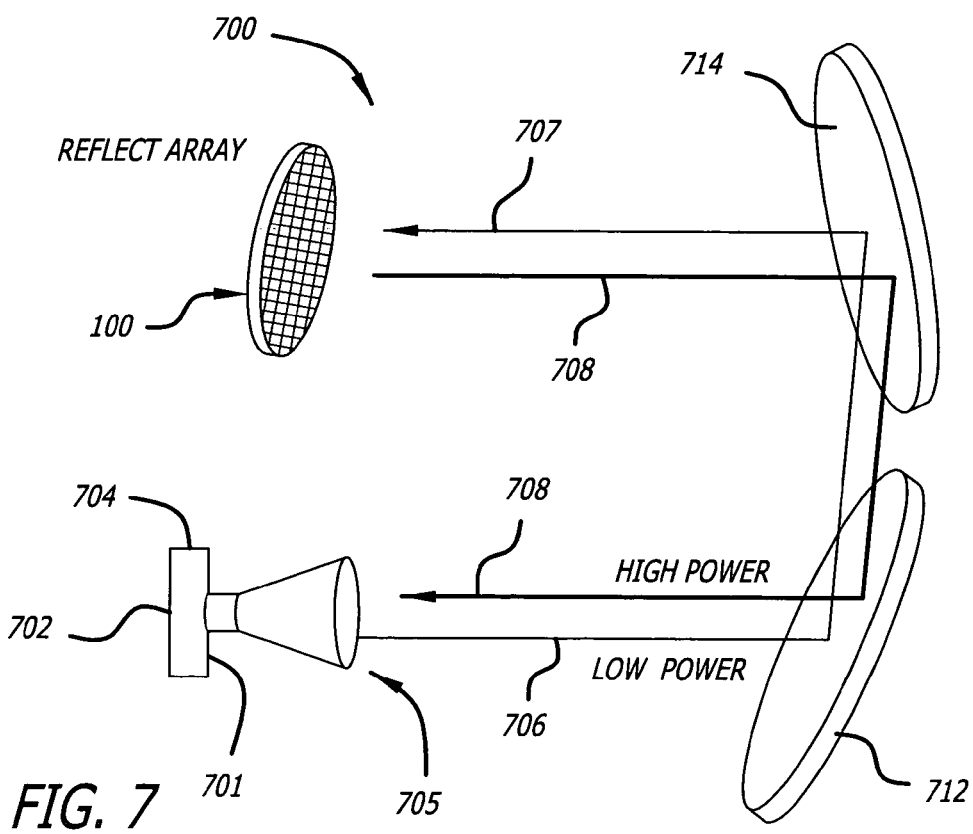
FIG. 7 is an alternative embodiment of the in-line amplifier of FIG. 6 by which dual shaped mirrors are used to convert the spherical wavefront from the feed horn into a planar wavefront.

FIG. 7 is an alternative embodiment of the in-line amplifier of FIG. 6. The embodiment of FIG. 7 offers an improved power distribution on the array via the use of first and second mirrors 712 and 714. The amplifier 700 of FIG. 7 includes an ortho-mode feed 701 having a low power horizontal waveguide input 702 which provides a low power input wave 706. The wave is output by an ortho-mode feed horn 705. In the illustrative embodiment, the input wavefront is a Gaussian illuminated spherical wavefront, which reflects off first and second mirrors 712 and 714, respectively. The mirrors are dual shaped mirrors designed to convert the Gaussian tapered spherical wave created by the feed horn 705 into a uniformly illuminated plane-wave in the shape of the reflect array 100. This insures that all of the reflect array unit cells receive the same amount of input power and therefore create the same output power level. Hence, the beam 707 output by the second mirror 714 illuminates the reflect array 100 with a uniformly illuminated planar wavefront. In accordance with the above teachings, the array 100 returns a high power collimated beam 708 with orthogonal polarization (in the illustrative implementation, vertical polarization) to the second and first mirrors 714 and 712 respectively. In the best mode, the dual mirrors 712 and 714 are reciprocal such that the reflected planar wavefront is converted back to a spherical wavefront that is efficiently received by the feed horn 705. Thus, the high power beam 708 reflected by the mirrors is collected by the horn 705 and output via a high power vertically polarized output port 704 thereof.

FIG. 8 shows an alternative by which the amplifier is implemented as a transmissive array in accordance with an illustrative embodiment of the teachings of the present invention. FIG. 8*a* shows a magnified view of a portion of the array of FIG. 8. FIG. 8*b* shows a front view of a single cell of FIG. 8*b* in accordance with an illustrative embodiment of the present teachings. FIG. 8*c* shows a rear view of the cell of FIG. 8*b*. FIG. 8 shows a portion of a monolithic transmission array amplifier 800 with an array 801 of unit cells 810. The chip is a monolithic semiconductor substrate 802 mounted on a heat sink (not shown) with holes 803 therein to accommodate the radiation of the backward facing antenna. In the partial view of the array of FIG. 8*b*, nine of the unit cells are shown. As illustrated in FIG. 8*b*, each unit cell 810 includes a receive antenna 812, a power amplifier 814 and a transmit antenna 816 (not shown in FIG. 8*b*). The transmit antenna 816 is shown in the rear view of FIG. 8*c*. In the illustrative embodiment, the receive antenna 812 and the transmit antenna 816 are patch antennas.

Each unit cell receives a portion of the input wavefront via the receive antenna thereof. The received signal is amplified and output to the transmit antenna. The transmit antenna radiates the amplified signal in the direction of the received wavefront. Thus, the wavefront is received, amplified and retransmitted in the same direction using the embodiment of FIG. 8. Those skilled in the art will appreciate that by phasing the signals fed to the transmit antennas of the unit cells, using a conventional beam control system and/or fixed or variable phase shifters (not shown) or by physically adjusting the pointing angle of the transmit antennas at the time of manufacture or using micro-electro-mechanical devices (MEMS), the direction of the output beam may be set at the time of fabrication or controlled dynamically per the requirements of a given application.

Figure 9:
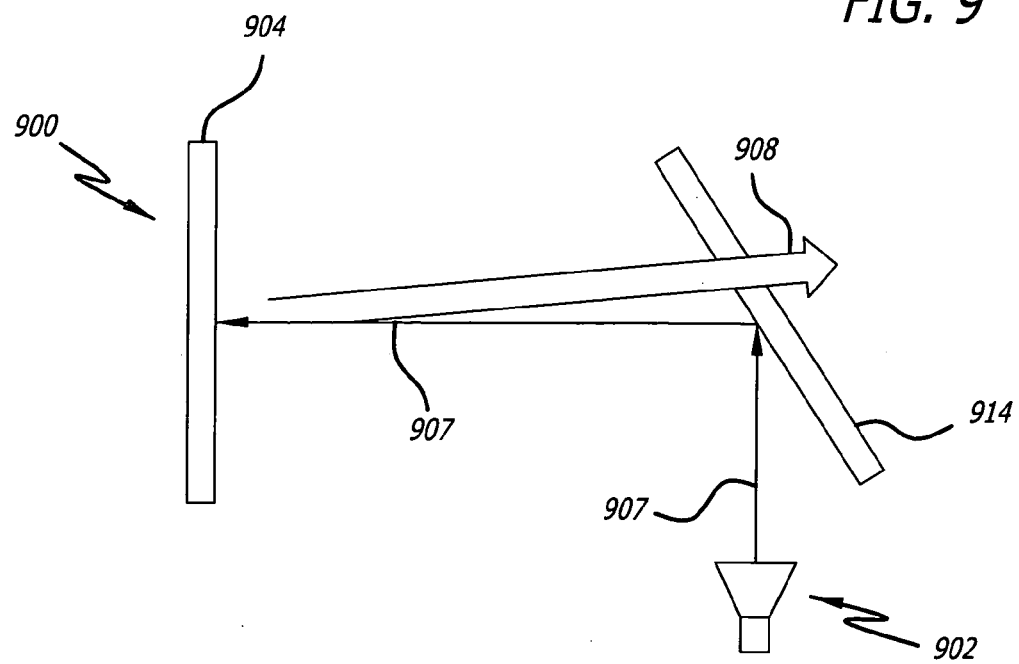
FIG. 9 shows an alternative arrangement utilizing the present teachings with a polarized reflecting element.

FIG. 9 shows an alternative arrangement utilizing the present teachings with a polarized reflecting element. The arrangement 900 includes a low power source 902, a reflect array 904 implemented in accordance with the present teachings and a polarized reflecting element 914. The polarized reflecting element 914 could be implemented with a series of parallel wires or other suitable means known in the art. The polarized reflecting element 914 is positioned to reflect low power energy 907 from the source 902 of one polarization is reflected to the array 904. Energy from the reflect array 904 of the orthogonal polarization is transmitted by the reflecting element 914 as a high power beam 908. Thus, the element 914 serves to allow a full power beam 908 to exit the system.

Figure 10:
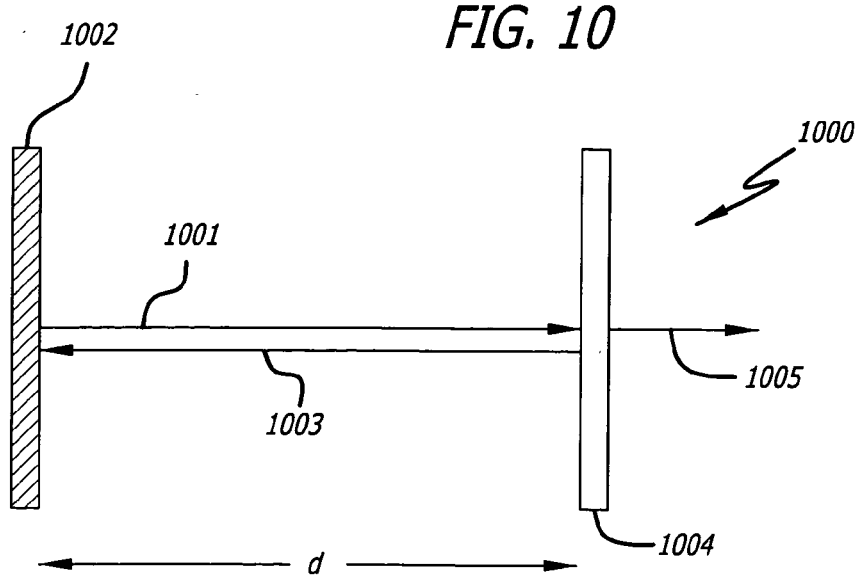
FIG. 10 shows an alternative arrangement for implementing an oscillator using a partly reflecting/partly transmissive surface in accordance with the present teachings.

FIG. 10 shows an alternate method of implementing an oscillator using a partly reflecting/partly transmissive surface in accordance with the present teachings. This arrangement 1000 eliminates the need for a low power feed. An amplifier array 1002, implemented in accordance with the present teachings, initially emits random signals that illuminate a partially reflective/partially transmissive surface 1004 with possibly different surfaces on each side of the element that can be different shapes including circular or parabolic concave to the cavity in the polarization corresponding to the feedback. Some or all of the transmissive surface 1004 causes a reflection of the beam 1003 due to discontinuities or rotations in a polarizing element. If for example plates 1002 and 1004 were linearly polarized in the same direction almost no RF energy would leave the cavity. By rotating plate 1004 a few degrees with respect to the polarization direction of plate 1003 most of the energy is still kept in the cavity but a small percentage of the cavities power would be allowed to escape as the output beam 1005. Most of the generated power is transmitted through the surface 1004 as the output beam 1005 of the system 1000. Some energy is fed back to the array 1002 to allow continued oscillation. The spacing 'd' of the Fabry-Perot oscillator cavity is set to the proper distance to allow the unit to operate at a given frequency. This method allows the phase locking with time of all elements on the array 1002. The return signal 1003 impinges several elements so elements in the array are locked in phase. Thus in effect the amplifier array 1002 becomes its own source.

Thus, those skilled in the art will appreciate that a novel aspect of the invention is that a monolithic element is used to maximize the power density. Other elements can be added or surfaces made other than planer in order to optimize or focus the output without departing from the scope of the present teachings.

A separate signal can be injected into the path of the oscillator by any method to cause the unit to operate and/or phase lock to a particular reference frequency.

Figure 11:
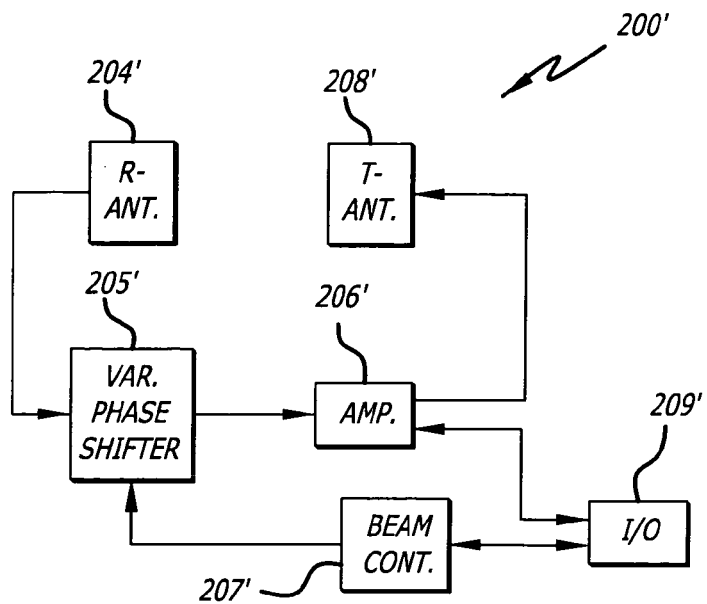
FIG. 11 is a block diagram of an alternative embodiment of an individual cell of the array of the present invention.

FIG. 11 is a block diagram of an alternative embodiment of an individual cell of the array of the present invention. In the embodiment of FIG. 11, phase shifters are added to the array 200' to implement beam steering. In the best mode, a variable phase shifter 205' is added between the transmit and the receive antennas 204' and 208' of each element. The amplifier 206' may be positioned before or after the phase shifter 205'. The phase shifters of each element are controlled by a conventional beam controller 207'. The beam controller 207' would be responsive to user input via a conventional interface shown generally at 209'.

Figure 12:
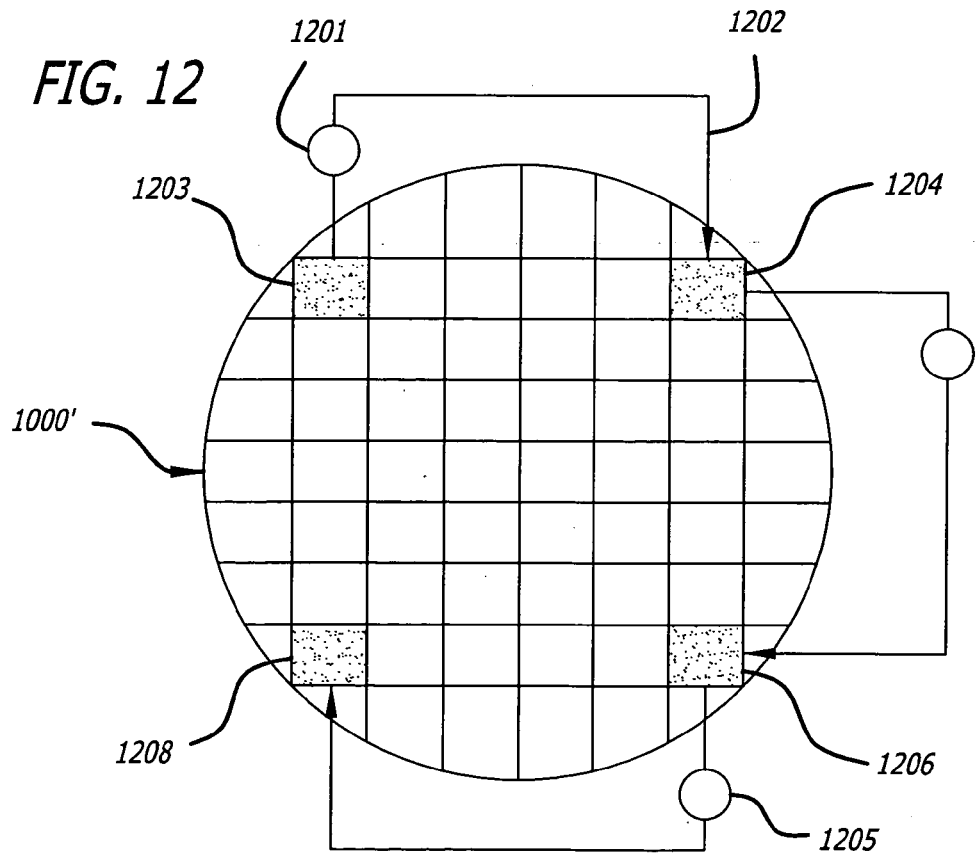
FIG. 12 is a diagram showing the invention implemented with a small number of phase shifters to provide a beam steering capability in accordance with an alternative embodiment of the present teachings.

In applications in which it may be prohibitively expensive to provide a phase shifter on each element to implement electronic steering in a full phased array with a large number of elements, system phasing and beam steering can be implemented with a smaller number of phase shifters as shown in FIG. 12.

FIG. 12 is a diagram showing the invention implemented with a small number of phase shifters to provide a beam steering capability in accordance with an alternative embodiment of the present teachings. In the embodiment of FIG. 12, a portion of a signal from the in-line amplifier described herein is radiated out into space and part of it is also run into a phase shifter 1201. The phased shifted signal is feed back to the array 1000' via a feedback path 1202 to a distant reflector element such as the surface 1004 in FIG. 10. This locks the phase between the two amplifier elements 1203 and 1204. This phase lock process can be repeated for a few more key elements (e.g. 1205, 1206, etc.) to allow the basic axis of possible tilt of the beam to be defined. Each amplifier element would feed back to adjacent elements around them. In part, this would be a leakage term. Thus, when implemented, changing the phase between a few elements far apart would cause all the elements between the two to linearly take a phase between the two. This in effect would allow the control of the few elements to allow beam steering or beam pointing stability.

The monolithic array 1000' would be designed using conventional techniques to have a degree of leakage in amplitude and phase as to allow feed back between elements sufficient for a given application. Having a monolithic amplifier array would allow the tight control and uniformity of elements needed to implement the scheme.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:
1. An oscillator comprising:
   an ortho-mode feed;
   a reflective amplifier array adapted to be illuminated by said feed with an input wavefront with a first polarization and to return thereto an amplified wavefront with a second polarization orthogonal to said first wavefront; and
   a partially reflective plate disposed between said feed and said amplifier.
2. The invention of claim 1 further including means for providing a Fabry-Perot cavity between said feed and said plate.
3. The invention of claim 1 wherein said plate is a polarized plate.
4. The invention of claim 3 wherein said plate has first and second surfaces.
5. The invention of claim 4 wherein said surfaces have dissimilar polarizations.
6. The invention of claim 4 wherein said surfaces have dissimilar curvatures.
7. The invention of claim 1 further including means for phase locking said amplifier.
8. The invention of claim 7 wherein said means for phase locking includes an orthomode converter.
9. The invention of claim 8 wherein said means for phase locking further includes means for injecting a reference signal.
10. The invention of claim 1 wherein said array includes:
    a monolithic semiconductor substrate and
    means disposed on said substrate for coherently receiving and retransmitting electromagnetic energy.
11. The invention of claim 10 wherein said means disposed on said substrate for coherently reflecting electromagnetic energy includes an array of cells.
12. The invention of claim 11 wherein each of said cells includes a first antenna for receiving said electromagnetic energy.
13. The invention of claim 12 wherein each of said cells includes an amplifier connected to said antenna.
14. The invention of claim 13 wherein each of said cells includes a second antenna for transmitting said electromagnetic energy.
15. The invention of claim 14 wherein at least one of said antennas is a patch antenna.
16. The invention of claim 15 said patch antenna is a corrugated patch antenna.

17. The invention of claim 14 further including means for receiving and retransmitting a beam of electromagnetic energy while controlling the direction thereof.

18. The invention of claim 17 wherein said means for receiving and retransmitting a beam of electromagnetic energy while controlling the direction thereof includes a phase shifter coupled between said first and said second antenna.

19. The invention of claim 14 wherein said means for receiving and retransmitting a beam of electromagnetic energy while controlling the direction thereof includes at least one phase shifter coupled between at least two of said cells.

20. The invention of claim 1 further including feed means for illuminating said array.

21. The invention of claim 20 wherein said feed means includes means for illuminating said array with a spherical wavefront.

22. The invention of claim 21 further including means for converting said spherical wavefront to a planar wavefront.

23. The invention of claim 22 wherein said means for converting said spherical wavefront to a planar wavefront includes at least one reflective element.

24. The invention of claim 23 wherein said means for converting said spherical wavefront to a planar wavefront includes first and second mirrors.

25. The invention of claim 24 wherein said first and second mirrors are dual shaped mirrors.

* * * * *